US006992292B2

(12) United States Patent
Cross

(10) Patent No.: US 6,992,292 B2
(45) Date of Patent: Jan. 31, 2006

(54) DETECTION OF TURBULENCE IN FLUIDS

(75) Inventor: Nicola Cross, Coventry (GB)

(73) Assignee: Infrared Integrated Systems Limited, Towcooter (GB)

( * ) Notice: Subject to any disclaimer, the term of this patent is extended or adjusted under 35 U.S.C. 154(b) by 259 days.

(21) Appl. No.: 10/441,591

(22) Filed: May 20, 2003

(65) Prior Publication Data

US 2003/0226967 A1 Dec. 11, 2003

(30) Foreign Application Priority Data

May 20, 2002 (GB) .................................... 0211563

(51) Int. Cl.
*H01L 25/00* (2006.01)

(52) U.S. Cl. ...................................................... 250/332

(58) Field of Classification Search ................. 250/332
See application file for complete search history.

(56) References Cited

U.S. PATENT DOCUMENTS 5,193,911 A * 3/1993 Nix et al. ................... 374/121
6,710,345 B2 * 3/2004 Carter et al. ............. 250/338.5

FOREIGN PATENT DOCUMENTS

| | | |
|---|---|---|
| EP | 0 818 766 | 1/1998 |
| GB | 2 269 454 | 2/1994 |
| GB | 2 339 277 | 1/2000 |
| WO | WO 01/97193 | 12/2001 |

OTHER PUBLICATIONS

EPC International Search Report, Application No. 03253096, dated Sep. 19, 2003.
British Patent Office Search Report, Application No. GB 0211563.2, dated Jan. 8, 2003.

* cited by examiner

*Primary Examiner*—David Porta
*Assistant Examiner*—Mindy Vu

(74) *Attorney, Agent, or Firm*—Patterson & Sheridan LLP

(57) ABSTRACT

A method of identifying the presence of turbulence in fluids, e.g. for distinguishing flames from other hot bodies, examines the correlation between adjacent pixels of an array viewing the fluid and particularly the proportion of negative correlation in the presence of strong positive correlation.

17 Claims, 2 Drawing Sheets

DETECTION OF TURBULENCE IN FLUIDS

BACKGROUND OF THE INVENTION

1. Field of the Invention

The present invention relates to the detection of turbulence in fluids, and is particularly applicable to determining whether a hot body viewed by a thermal detector array is a flame.

2. Description of the Related Art

In flame detection, it is useful to be able to distinguish flame signals (the majority of which are dominated by low frequency modulation) from other low frequency events (false alarms). These false alarms generally emanate from some stationary hot black body (e.g.: the sun, electric fire) which are modulated by objects that move between them and the detector, creating modulated signals that can look very like flames.

In contrast, fires create turbulence when the burning fuel creates balls of hot gas. So, given that the fire is positioned such that it covers more than one pixel on the array, this turbulence will manifest itself in the image. In particular, this work focuses on the differences and similarities between a pixel's time-series data and those of its horizontal and vertical neighbors. The novelty of this invention lies in the use of statistical measurement of variation as a pattern recognition procedure.

GB-A-2269454 discloses a method of flame detection by imaging. It is a tenet of this method that an image of a flame will have a structure such that its measurement over time will identify the various regions of the flame. Cross-correlation techniques are used, but these are standard statistical measures used in numerous applications.

Our earlier patent application GB-A-2366369 (Upwards Correlation) discloses a method of identifying turbulence in fluids based on the progression of flame features in a single direction within a flame cluster. Thus this method needs to track over time and assumes some underlying structure in the flame cluster, whereas the new invention always works at zero lag and makes no assumptions about spatial organization.

A difficulty of Upwards Correlation in practice occurs when the speed of thermal bleed (described below) matches the speed of flame movement. Under these circumstances, it becomes impossible to accurately quantify the correlation of features between adjacent pixels. Thus with Upwards Correlation, we can get both false positives and negatives in flame detection. The new invention looks primarily for extremes in negative correlation—a situation which is not affected by thermal bleed.

SUMMARY OF THE INVENTION

The invention generally relates to a method of identifying the presence of turbulence in fluids, e.g. for distinguishing flames from other hot bodies, examines the correlation between adjacent pixels of an array viewing the fluid and particularly the proportion of negative correlation in the presence of strong positive correlation.

The present invention provides a method of identifying the presence of turbulence in a fluid comprising:

forming a two dimensional image of the fluid divided into a two dimensional array of pixels;

periodically obtaining a signal indicating the amount of radiation emitted from each part of the fluid corresponding to a pixel;

for each pair of adjacent pixels, periodically calculating a coefficient relating to the correlation of signals from the two pixels in the pair;

examining the distribution of correlation coefficient values; and identifying whether turbulence is present on the basis of the relative proportions of positive and negative correlation values.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
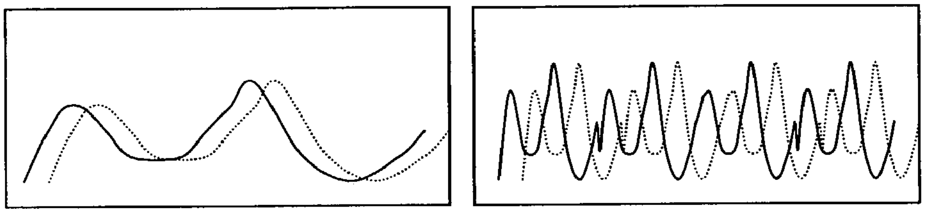
FIG. 1 comprises two graphs comparing signals from two adjacent pixels, one shown in solid line and one shown in dotted line, representing events having different frequencies.

As will be explained in more detail below, the invention is based on the discovery that for flames, the characteristic distribution of correlation values includes significant negative correlation in the presence of strong positive correlation.

In contrast with the method described in our earlier patent application mentioned above, the present invention may work at zero lag and makes no assumptions about spatial organization.

The invention enables identification of turbulence without reference to its orientation, and without reference to regions. Thus it could identify a flame or other turbulent fluid even if it was only partly within the image.

Numerical Theory

The similarity or cross-correlation of the signal between adjacent pixels can be measured using the 'population correlation coefficient'. This is a standard statistical technique that yields a number, which lies in the range −1 to +1. A value of +1 indicates perfect correlation (the two signals are the same), 0 indicates no correlation (the signals are unrelated), and −1 indicates that the signals are negatively correlated (one is the exact inverse of the other). Most values obtained will lie somewhere between these landmarks. The population correlation coefficient, r is given by:

$$r=C(x, y)/s_x s_y \quad (1)$$

That is, the covariance of the time series from pixels x and y, divided by the product of their standard deviations. The covariance and variance are defined as:

$$C(x, y) = \sum (x-\bar{x})(y-\bar{y})/(n-1), \tag{2}$$

n being the length of the time series.

$$s_x^2 = \sum (x-\bar{x})(x-\bar{x})/(n-1) \tag{3}$$

$$s_y^2 = \sum (y-\bar{y})(y-\bar{y})/(n-1)$$

It is unnecessary to correlate over different lags for this work since it is precisely at zero lag that any differences in the signals of adjacent pixels have the greatest significance. This is an advantage because it cuts processing to a minimum.

The method of the invention has been developed for use with arrays of pyroelectric detector elements for the purpose of identifying flames. However it will be appreciated that the invention may have other applications. Examples of suitable arrays are described in our earlier European patent application EP-A-0853237.

Rationale

The signal pattern generated from sources with complex modulation can be difficult to interpret on pyroelectric detectors that do not have a flat frequency response. The current invention is an example of a 'data-driven' approach which, rather than attempting to recover the nature of the signal before it reaches the array (and is transformed by it in a complex fashion), seeks to find features in the data as it presents on the array.

The preferred method according to this invention uses an array whose detector elements are not completely thermally isolated, preferably constructed from a single piece of material, and thus exploits the phenomenon of thermal bleed that is found in multi-element pyroelectric detectors. Thermal bleed is evident when a signal from any source reaches a pixel on the array. At low frequencies (less than 10 Hz), the thermal energy that is generated at that pixel will quickly move into any neighbouring pixels that have a lower temperature. This lateral conduction of heat has the effect that, over time, and in the absence of further signals, all elements will reach thermal equilibrium. Heat is also lost to the silicon beneath the array, but this is a general decay process that applies equally to all pixels, and is not part of the thermal bleed phenomenon as such.

If the correlation between two adjacent pixels is measured in the absence of any modulation, it will be very high. The correlation will also be very high if the adjacent pixels are receiving similar signals. When the signals are modulated, correlation measurements are indirectly affected by factors that affect thermal bleed levels:

1. Frequency—low frequency modulation produces higher levels of thermal bleed than high frequency signals.
2. Signal strength—strong signals bleed more than weak signals (although by the same fraction).

In addition to the frequency effect mentioned above, correlations calculated at zero lag are biased towards low frequency events. This is evident from FIG. 1 where a lag of equal size for both plots is illustrated by the dashed line. For low frequency events (left) we would obtain a higher level of correlation at zero lag than for a higher frequency (right).

Most importantly here, the type of modulation affects correlation measurements. It has been discovered empirically that when a stationary hot body is modulated, it is not possible to induce negative correlations in adjacent pixels at zero lag. The signals may be disturbed to a point where adjacent pixels become uncorrelated, but these do not become negatively correlated to any level of statistical significance.

For flame, experimental work has shown that adjacent pixels do show statistically significant negative correlation. It is not entirely clear why this should happen in flames and not in false alarms, but it is likely to be the result of the rapid movement of flame features in combination with the varied nature of flame flicker frequency. (Signals from moving hot black bodies can occasionally create similar correlation patterns to those generated by flames. Distinguishing these is not the intention of this work.) The incidence of these negative correlations in flame is low, but its occurrence in the presence of more dominant positive correlations is highly significant, and can be used as a way of identifying flame. Thus in image processing terms, the results of cross-correlating adjacent pixels become the data representation, and the correlation profile becomes the pattern description.

An embodiment of the invention will now be described by way of example only and with reference to the accompanying drawings in which:

FIG. 1 comprises two graphs comparing signals from two adjacent pixels, one shown in solid line and one shown in dotted line, representing events having different frequencies.

Figure 2:
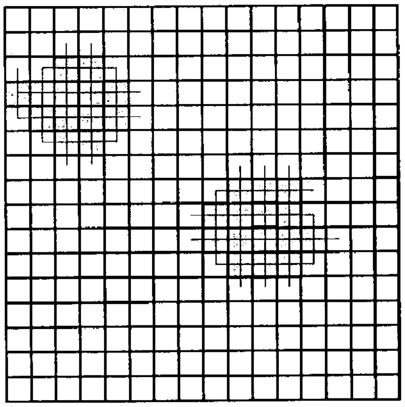
FIG. 2 shows an image formed on a 16×16 array in which two clusters of pixels possible representing flames have been identified.

FIG. 2 shows an image formed on a 16×16 array in which two clusters of pixels possible representing flames have been identified.

Figure 3:
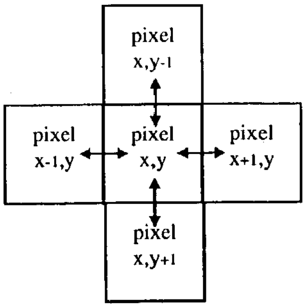
FIG. 3 shows the cross correlation neighborhood for a single pixel.

FIG. 3 shows the cross correlation neighborhood for a single pixel.

Figure 4:
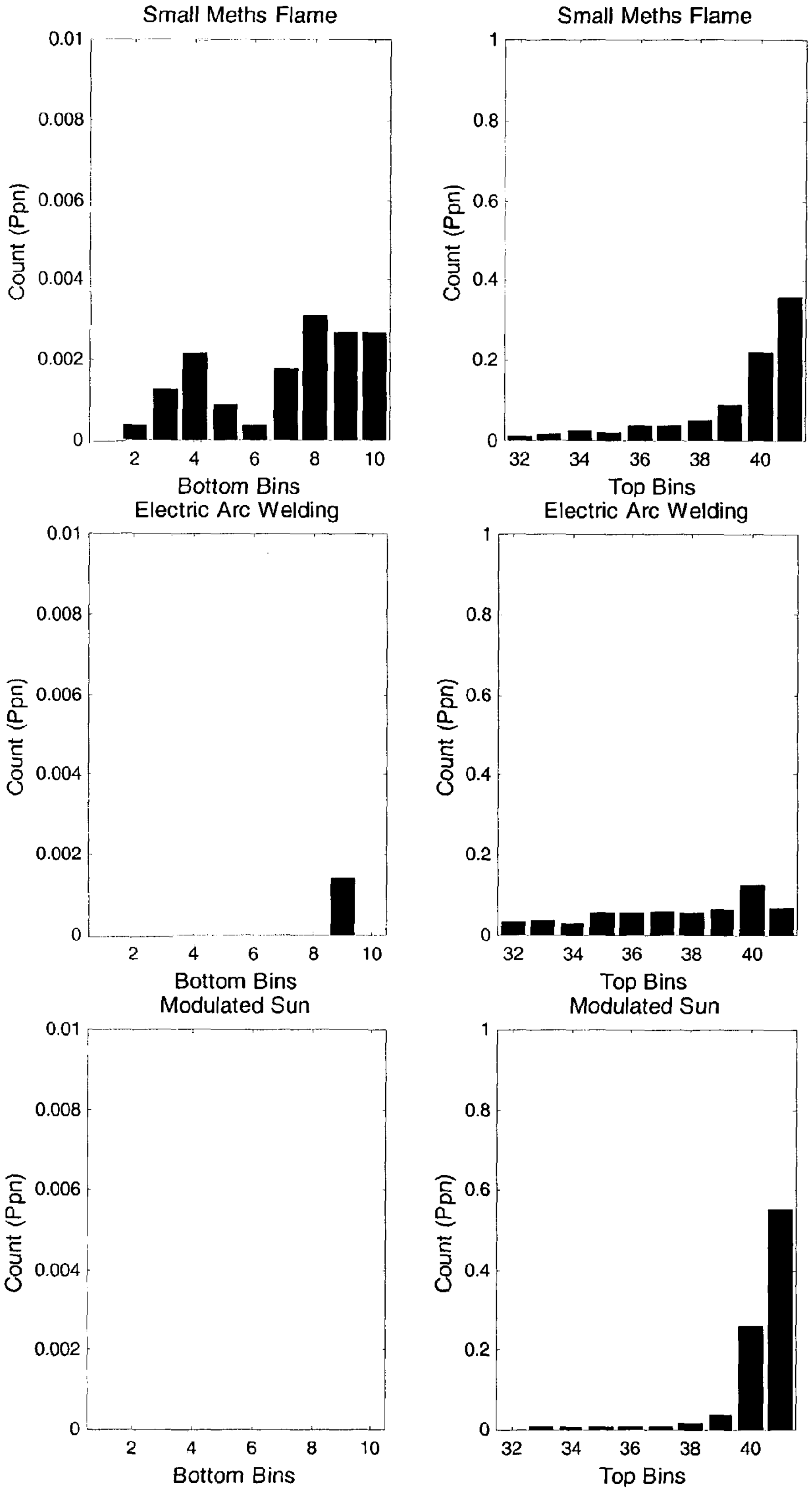
FIG. 4 is a set of graphs showing the distribution of cross correlation values for a flame, a welding source and modulated sunlight.

FIG. 4 is a set of graphs showing the distribution of cross correlation values for a flame, a welding source and modulated sunlight.

The following describes a method that has been developed using data collected from flames and false alarms on an uncompensated IRISYS (RTM) Redeye 1 device fitted with a germanium 4.3±0.2 micron 'flame' filter and a 90° sapphire lens. The 16×16 element array is sampled 122 times every second. The data are subjected to a dynamic procedure in which active groups of elements, i.e. elements which might be viewing a flame, are 'clustered' together (not part of this invention). Any cluster that persists is submitted to analysis by a set of algorithms that look for evidence of turbulence.

As the 16×16 array data arrives it is stored (preferably for 32 frames, ~0.25 seconds) until sufficient data exists for a single iteration of the analysis procedure. There may be more than one cluster present, (as shown in FIG. 2) so the analysis is performed for each one, and the results are maintained separately. The results from a single iteration are 'probability of flame' measures for each cluster.

Since flames exhibit chaotic behaviour, in the short-term the correlation results contain a large amount of natural variation. It is therefore important to generate smoothed values taken from some much longer period of time. For this reason, a history of the results is kept. The immediate results from the analysis are kept in a "histogram" type data structure. In this, each bin contains a count of the number of times a pair of pixels in the cluster produces a value for r that falls within the range of that bin. A short-term or 'working' histogram contains the results from the current analysis calculated over the whole cluster. The 'history' is kept in the form of a cyclic buffer of past histograms. All histograms have the same number of bins. If (say) 10 bins were chosen, a single histogram would be:

| bin | 1 | 2 | 3 | 4 | 5 | 6 | 7 | 8 | 9 | 10 |
|---|---|---|---|---|---|---|---|---|---|---|
| range | −1.0 . . . −0.8 | −0.8 . . . −0.6 | −0.6 . . . −0.4 | −0.4 . . . −0.2 | −0.2 . . . 0.0 | 0.0 . . . 0.2 | 0.2 . . . 0.4 | 0.4 . . . 0.6 | 0.6 . . . 0.8 | 0.8 . . . 1.0 |

In practice, 20 bins produce good results. As part of the clustering process, a list of all the coordinates of pixels that belong to a cluster is generated. For each of these member pixels, the population correlation coefficients r between itself and its four immediate horizontal and vertical neighbours are calculated according to equation 1, subject to the following constraints:

1. That the neighbor exists (clearly, edge pixels have fewer neighbors)
2. That this link has not already been calculated by another pixel (links are reciprocal).

Each time r is calculated for a pair of pixels, the results are added (binned) into the working histogram. When all pixels have been processed, the working histogram contains a profile of the short-term correlations (b) over the full range of −1 to +1 for the current time interval.

The summation is made over a fixed length period of time. The process is performed in 'chunks' (to reduce the amount of processing required). The first calculation is made only after this period of time has passed i.e.: there is a (very) small lag between a cluster appearing and the first calculation of r.

The process algorithm is briefly as follows:

After n frames have passed since last process (typically n=32):

1. Select the first/next cluster.
2. Empty the 'working' histogram.
   a) Select the first/next pixel pair.
   b) Get the (length n) time series for each pixel from time (t−n+1) to (t).
   c) Calculate r.
   d) Determine which bin contains the value for r. This is i.
   e) Increment the count of bin i.
   f) Continue from a) or end if all pixel pairs done
3. Express bin contents as fractions of the total count.
4. Copy working histogram to history (if full, oldest value drops off).
5. Calculate turbulence coefficient from history.
6. Continue from 1 or end.

In fact, it is not necessary to tie the size of the gap between processing directly to the lengths of the data time series—if required, there could be an overlap e.g.: process every 16 frames, looking back 32 frames.

Next, the values are adjusted so that they indicate the proportion of counts in each bin. This makes the algorithm invariant to cluster size. The value (d) for the ith bin becomes simply:

$$d_i = \frac{b_i}{\sum_j b_j} \tag{4}$$

Recall that the pattern for flame typically shows a large proportion of very positive correlations in conjunction with a small proportion of very negative correlations.

The graphs of FIG. 4 document three different cases: a flame, a modulated hot body and electric arc welding. The figures show the top and bottom ¼ bins of a typical working histogram state (for 41 bins) in each case. At the point at which these data are collected, the bin counts have been adjusted to express the counts as a proportion of the total in all bins (i.e. d above). Note that only the flame shows significant content in both top and bottom end bins.

The following treatment of the histogram data seeks to derive a measure that maximises sensitivity to this pattern and minimises sensitivity to non-conforming patterns.

Statistically, we have n−2 levels of freedom (n being the length of the data time-series) when considering the correlation results. For n=32 therefore, there are 30 levels of freedom. To a significance level of 0.01, bins containing values of approximately −0.5>r>0.5 are significant, so the first and last quarters of the bins are used.

The maximum value in the top (positive) quarter of the bins ($d_{max}^+$) is found and used to adjust all the first (negative) quarter bins, as:

$$e_i = d_i . d_{max}^+, \tag{5}$$

where i indexes the negative first quarter of (critical) bins.

Intuitively described, this gives the negative end bins a larger value in the presence of high positive end presence. Some high-frequency false alarms (e.g. welding) will generate high negative bin entries, but these have lower correlation throughout. In these cases, $d_{max}^+$ is low, so $e_i$ becomes low also. As a side effect, high frequency (small gas) flames are also excluded.

The adjusted working histogram (e) then becomes the latest entry in the histogram history (f). If the history is full, then the oldest entry is overwritten.

At this point, the current estimate of turbulence can be made. Averaging the history for each of the critical bins and summing the results gives a reliable measure of turbulence:

$$\bar{f}_i = \frac{\sum_{t=1}^{m} f_{i,t}}{m}, \text{ where } m \text{ is the history length (typically 16)} \tag{6}$$

$$T = \sum_i \bar{f}_i \tag{7}$$

The parameters for m (the number of entries in the history) and n (the time represented by each entry in the history) are expressed here as frames (assuming a data acquisition rate of 122 frames per second), but are related to real-time flame features. In real time, the timings translate to a total history length of four seconds, split into 16, 0.25 second intervals. This is optimal for free-burning hydrocarbon flames.

T is the measure of turbulence from which an F or 'probability of flame' measure can be derived (the scale is set empirically). For free-burning hydrocarbon fuels, such as petrol, F is calculated in the range 0 to 1 as:

$$1 \geqq 500 \cdot T \geqq 0 \quad (8)$$

For analysis over longer periods of time, F is further smoothed using exponential averaging:

$$F'(t) = a \cdot F(t) + (1-a) \cdot F'(t-1), \text{ (Typically, } a=0.5) \quad (9)$$

At F=0 there is zero probability of flame. When F=1, flame is certain. F=0.2 is a good, practical threshold if a 'hard' decision is required.

The whole process is summarized in the algorithm description below.

Algorithm

1. Every n (e.g. 32) frames
    a. For each cluster c
        i. For new clusters, zero histogram history for c
        ii. Zero working (short-term) histogram
        iii. For each pixel in the cluster
            1. Calculate r between all pairs of adjacent pixels over n frames.
            2. 'Bin' counts into the working histogram
        iv. Calculate the fraction of entries in each working bin ($d_i$)
        v. Correct critical low end bins using high end correlation ($e_i$)
        vi. Update long term histogram history using results from v ($f_{i,t}$)
        vii. Calculate a mean value ($\bar{f}$) for each critical bin based on the last m entries in the history (e.g.: m=16)
        viii. Calculate overall "turbulence" coefficient (T).
        ix. Generate "probability of flame" measure (F) from 0
    b. Continue
2. Continue While the foregoing is directed to embodiments of the present invention, other and further embodiments of the invention may be devised without departing from the basic scope thereof, and the scope thereof is determined by the claims that follow.

What is claimed is:

1. A method of identifying the presence of turbulence in a fluid in order to determine whether the fluid is a flame, the method comprising:

forming a two dimensional image of at least part of the fluid divided into a two dimensional array of pixels;

periodically obtaining a signal indicating the amount of radiation emitted from each part of the fluid corresponding to a pixel;

for each pair of adjacent pixels, periodically calculating a coefficient relating to the correlation of signals from the two pixels in the pair; and using the distribution of correlation coefficient values to determine the probability that the fluid is a flame on the basis that a flame is characterised by a significant proportion of negative correlation values in the presence of large positive correlation values.

2. The method as claimed in claim 1 comprising forming the image of the fluid on a two dimensional array of thermal detector elements with each element corresponding to a pixel.

3. The method as claimed in claim 2 comprising using a detector array in which the detector elements are not completely thermally isolated whereby some thermal energy detected by one element is conducted to the elements adjacent to that element.

4. The method as claimed in claim 3 in which the detector array used for the formation of the image is constructed from a single piece of material.

5. The method as claimed in claim 1 in which only the populations of a range of the largest positive correlation values and a range of the largest negative correlation values are used in order to determine whether turbulence is present in the fluid.

6. The method as claimed in claim 1 in which, in order to examine the distribution of correlation values, the values are collected into bins, each bin representing a correlation value range and containing a count of the number of times a pair of pixels produces a correlation value within the range of that bin; and the value d in each bin in a predetermined subset of bins including the maximum possible negative correlation value is multiplied by the maximum positive value $d_{max}$, to obtain an adjusted bin value $e_i$ in which i represents bin number.

7. The method as claimed in claim 6 in which a turbulence coefficient T is calculated from the sum of bin values.

8. The method as claimed in claim 7 in which T is calculated from the following equations:

$$T = \sum_i \bar{f}_i$$

$$\bar{f}_i = \frac{\sum_{t=1}^{m} f_{i,t}}{m},$$

where m is history length and f represents values of e stored in a correlation history.

9. The method as claimed in claim 8 including deriving a scale of turbulence coefficients T and the probability F that a fluid is a flame on the basis of past experimental results and using the scale to determine a value indicating that a fluid being viewed is a flame.

10. The method as claimed in claim 9 including forming a two dimensional image of the scene divided into a two dimensional array of pixels, and identifying a cluster of pixels that may include a flame, the cluster being the two dimensional image of the fluid.

11. The method as claimed in claim 1 in which the correlation coefficient values are calculated from the population correlation coefficient r defined by the equation:

$$r = C(x, y)/s_x s_y$$

where the covariance $$C(x, y) = \sum (x-\bar{x})(y-\bar{y})/(n-1),$$

n is the length of the time series over which r is calculated and x and y represent different pixels, $s_x$ and $s_y$ are the standard deviations for x and y.

12. A method of identifying the presence of turbulence in a fluid comprising:

forming a two dimensional image of at least part of the fluid divided into a two dimensional array of pixels;

periodically obtaining a signal indicating the amount of radiation emitted from each part of the fluid corresponding to a pixel;

for each pair of adjacent pixels, periodically calculating a coefficient relating to the correlation of signals from the two pixels in the pair;

examining the distribution of correlation coefficient values, whereby the values are collected into bins, each bin representing a correlation value range; and the value d in each bin is multiplied by the maximum value of d in a predetermined range of values including the maximum possible correlation value, to obtain an adjusted bin value $e_i$ in which i represents bin number; and identifying whether turbulence is present on the basis of the relative proportions of positive and negative correlation values.

13. The method as claimed in claim 12 in which a turbulence coefficient T is calculated from the sum of bin values.

14. The method as claimed in claim 13 in which T is calculated from the following equations:

$$T = \sum_i \overline{f}_i$$

$$\overline{f}_i = \frac{\sum_{t=1}^{m} f_{i,t}}{m},$$

where m is history length and of represents values of e stored in a correlation history.

15. The method as claimed in claim 14 in which the distribution of correlation coefficient values is used to determine a figure F representing the probability that fluid is a flame on the basis that a flame is characterized by a significant proportion of negative correlation values in the presence of large positive correlation values including deriving a scale of turbulence coefficients T and the probability F that a fluid is a flame on the basis of past experimental results and using the scale to determine a value indicating that a fluid being viewed is a flame.

16. The method as claimed in claim 15 for detecting a flame in a scene including forming a two dimensional image of the scene divided into a two dimensional array of pixels, and identifying a cluster of pixels that may include a flame, the cluster being the two dimensional image of the fluid.

17. A method of identifying the presence of turbulence in a fluid comprising:

forming a two dimensional image of at least part of the fluid divided into a two dimensional array of pixels;

periodically obtaining a signal indicating the amount of radiation emitted from each part of the fluid corresponding to a pixel;

for each pair of adjacent pixels, periodically calculating a coefficient relating to the correlation of signals from the two pixels in the pair;

examining the distribution of correlation coefficient values, whereby the correlation coefficient values are calculated from a population correlation coefficient r is defined by the equation:

$$r = C(x, y)/s_x s_y$$

where the covariance $$C(x, y) = \sum (x - \overline{x})(y - \overline{y})/(n-1),$$

n is the length of the time series over which r is calculated and x and y represent different pixels, $s_x$ and $s_y$ are the standard deviations for x and y; and identifying whether turbulence is present on the basis of the relative proportions of positive and negative correlation values.

* * * * *

UNITED STATES PATENT AND TRADEMARK OFFICE

CERTIFICATE OF CORRECTION

PATENT NO. : 6,992,292 B2
APPLICATION NO. : 10/441591
DATED : January 31, 2006
INVENTOR(S) : Nicola Cross It is certified that error appears in the above-identified patent and that said Letters Patent is hereby corrected as shown below:

On the title page:

In Item (73), Assignee, second line, please delete "Towcooter" and insert --Northants--.

Signed and Sealed this

Fourteenth Day of November, 2006

JON W. DUDAS
*Director of the United States Patent and Trademark Office*